United States Patent
Kashiwazaki

(10) Patent No.: US 6,721,232 B2
(45) Date of Patent: Apr. 13, 2004

(54) SEMICONDUCTOR DEVICE HAVING PHASE ERROR IMPROVED DLL CIRCUIT MOUNTED THEREON

(75) Inventor: Yasuhiro Kashiwazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/172,908

(22) Filed: Jun. 18, 2002

(65) Prior Publication Data

US 2003/0112697 A1 Jun. 19, 2003

(30) Foreign Application Priority Data

Dec. 19, 2001 (JP) ........................................ 2001-386430

(51) Int. Cl.[7] .................................................. G11C 8/00
(52) U.S. Cl. ........................ 365/233; 365/194; 365/226
(58) Field of Search ................................. 365/233, 194, 365/226; 327/143, 156, 158, 161

(56) References Cited

U.S. PATENT DOCUMENTS 6,166,990 A * 12/2000 Ooishi et al. ............... 365/233
6,212,127 B1 * 4/2001 Funaba et al. .............. 365/233
6,269,051 B1 * 7/2001 Funaba et al. .............. 365/233
6,456,129 B1 * 9/2002 Tsukude ..................... 327/156

* cited by examiner

Primary Examiner—Gene Auduong
(74) Attorney, Agent, or Firm—McDermott, Will & Emery

(57) ABSTRACT

Two delay lines included in a DLL circuit receive clock signals complementary to each other to output complementary clock signals CLKP and CLKN for data output. A power supply generation circuit applying a power supply to the two delay lines is arranged at an equivalent position from the two delay line. An equal potential is supplied to the two delay lines by, for example, setting lengths of two power supply lines from a branch point equal to each other. By doing so, delay time of one delay line can be set equal to delay time of the other delay line and a phase error between clock signals CLKP and CLKN can be reduced. Therefore, a semiconductor device on which the DLL circuit having the improved phase error is mounted can be provided.

16 Claims, 13 Drawing Sheets

US 6,721,232 B2

SEMICONDUCTOR DEVICE HAVING PHASE ERROR IMPROVED DLL CIRCUIT MOUNTED THEREON

BACKGROUND OF THE INVENTION

1. Field of the Invention

The present invention relates to a semiconductor device and more particularly to a semiconductor memory having a delay locked loop (DLL) circuit mounted thereon.

2. Description of the Background Art

In recent years, the operations of semiconductor devices have been increasingly accelerated. As one of the semiconductor devices required to perform high rate operation, there is known a double data rate synchronous dynamic random access memory (DDR SDRAM).

DDR SDRAM can transmit data in a cycle half as long as that of an external clock signal. It is a standard that DDR SDRAM outputs data at timing synchronous with the rising edge and the falling edge of an external clock signal. If data is outputted with the external clock signal used as a trigger, an internal delay occurs to DDR SDRAM and DDR SDRAM cannot satisfy this standard. To satisfy the standard, a DLL circuit is mounted on DDR SDRAM.

FIG. 21 is a block diagram for explaining a conventional DLL circuit 516.

Referring to FIG. 21, DLL circuit 516 delays clock signals BUFFCLK and BUFFZCLK applied from the outside of DLL circuit 516 by a fixed delay and a variable delay to generate clock signals CLKP and CLKN for data output, respectively. DLL circuit 516 then feeds back clock signal CLKP applied to a DQ buffer 514, compares the phase of clock signal CLKP thus fed back with that of clock signal BUFFCLK applied from the outside of DLL circuit 516 and thereby adjusts a variable delay quantity. As a result, if data is outputted synchronously with data output clock signal CLKP, it is possible to always synchronize the phase of the clock signal applied from the outside thereof with that of the outputted data.

Complementary clock signals are inputted into DDR SDRAM from the outside of DDR SDRAM. Therefore, DLL circuit 516 receives clock signals BUFFCLK and BUFFZCLK corresponding to the complementary clock signals applied from the outside of DDR SDRAM, respectively.

DLL circuit 516 includes delay lines 532 and 533 which receive and delay clock signals BUFFCLK and BUFFZCLK, respectively. Delay line 532 delays clock signal BUFFCLK in accordance with control signals A[2:0] and outputs clock signal CLKP. Delay line 533 delays clock signal BUFFZCLK in accordance with control signals A[2:0] and outputs clock signal CLKN.

DLL circuit 516 also includes a replica buffer 534 which delays clock signal CLKP by a predetermined quantity and outputs clock signal FBCLK so as to feed back clock signal CLKP, and a phase comparison circuit 538 which compares the phase of clock signal BUFFCLK with that of clock signal FBCLK and outputs control signals A[2:0] in accordance with the phase difference.

DQ buffer 514 outputs data which is to be outputted at the timing of the rising edge of an external clock signal, synchronously with the rising edge of clock signal CLKP. In addition, DQ buffer 514 outputs data which is to be outputted at the timing of the falling edge of the external clock signal, synchronously with the rising edge of clock signal CLKN.

As described above, DLL circuit 516 is required to feed back data output clock signal CLKP so as to make the phase of the external clock signal coincident with that of outputted data. According to the configuration shown in FIG. 21, only clock signal CLKP out of data output clock signals CLKP and CLKN is fed back to DLL circuit 516 and the phase comparison result of phase comparison circuit 538 is shared between delay lines 532 and 533 for adjusting the variable delay quantities thereof, respectively. By doing so, it suffices to provide only a pair of a phase comparison circuit and a replica buffer, making it possible to suppress a layout area from increasing.

However, if the variable delay of each of delay lines 532 and 533 is realized by inverters, a problem sometimes arises due to the fact that only clock signal CLKP is fed back to DLL circuit 516. For example, the two delay lines slightly differ in operating power supply voltage.

FIG. 22 is an explanatory view for the problem of the conventional DLL circuit.

Referring to FIG. 22, delay lines 532 and 533 which receive complementary clock signals BUFFCLK and BUFFZCLK, respectively, are supplied with a power supply potential VDD4 from a power supply generation circuit 572. Power supply generation circuit 572 is normally provided to be dedicated to the DLL circuit, receives an external power supply potential of, for example, 2.5 V and generates 2.1V as power supply potential VDD4.

It is assumed herein that, as shown in FIG. 22, delay line 533 is supplied with the power supply potential from power supply generation circuit 572 by way of power supply lines PSL11 and PSL12 and that delay line 532 is supplied with the power supply potential by way of power supply lines PSL11 and PSL13.

In FIG. 22, power supply lines PSL12 and PSL13 differ in length. If the lengths of power supply lines PSL12 and PSL13 differ, the resistance of power supply line PSL 12 differs from that of power supply line PSL 13. As a result, there is a probability that the power supply potential supplied to delay line 532 slightly differs from that supplied to delay line 533.

In that case, even if the clock signals are adjusted to be passed through the same number of inverters using the same control signals A[2:0], the delay quantity of delay line 533 differs from that of delay line 532. For example, it is assumed that the power supply potential of one of the delay lines is lowered by 0.05V and the delay quantity of the delay circuit per inverter relatively increases by 5 ps. In this case, if 100 inverters are used for the delay line, the phases of the two delay lines are shifted by as much as 500 ps. In other words, although the phase difference between complementary clock signals BUFFCLK and BUFFZCLK is 180°, the phase difference between data output clock signals CLKP and CLKN is deviated from 180°.

Since clock signal CLKP is always fed back to DLL circuit, it is possible to make the phase of the data outputted at the timing of the rising edge of clock signal CLKP coincident with that of the external clock signal. However, since the phase difference between clock signals CLKP and CLKN is deviated from 180°, the phase of the data outputted at the timing of the rising edge of data output clock signal CLKN is not coincident with that of the external clock signal. This makes it difficult to satisfy the standard for data output timing.

SUMMARY OF THE INVENTION

It is an object of the present invention to provide a semiconductor device capable of outputting appropriate clock signals complementary to each other in phase if a DLL circuit which feeds back only one of the complementary clock signals so as to decrease a layout area is mounted on the semiconductor device.

In short, according to one aspect of the present invention, there is provided a semiconductor device which includes a delay locked loop circuit and a potential supply section.

The delay locked loop circuit generates first and second internal clock signals in accordance with first and second external clock signals complementary to each other and applied from an outside, respectively.

The delay locked loop circuit includes first and second variable delay circuit, a delay circuit and a phase comparison circuit. The first variable delay circuit delays the first external clock signal, and outputs the first internal clock. The second variable delay circuit delays the second external clock signal, and outputs the second internal clock signal. The delay circuit receives and delays the first internal clock. The phase comparison circuit compares a phase of an output of the delay circuit with a phase of the first external clock signal, and outputs a control signal according to a phase difference to the first and second variable delay circuits.

The potential supply section is connected to the first variable delay circuit, connected to the second variable delay circuit in an electrically equivalent connection relationship to connection to the first variable delay circuit, and supplies a power supply potential to the first and second variable delay circuits.

According to another aspect of the present invention, there is provided a semiconductor device which includes a delay locked loop circuit, an output buffer circuit and first and second clock signal lines.

The delay locked loop circuit generates first and second internal clock signals in accordance with first and second external clock signals complementary to each other and applied from an outside, respectively.

The delay locked loop circuit includes first and second variable delay circuits, a delay circuit and a phase comparison circuit. The first variable delay circuit delays the first external clock signal, and outputs the first internal clock signal. The second variable delay circuit delays the second external clock signal, and outputs the second internal clock signal. The delay circuit receives and delays the first internal clock signal. The phase comparison circuit compares a phase of an output of the delay circuit with a phase of the first external clock signal, and outputs a control signal according to a phase difference to the first and second variable delay circuits.

The output buffer circuit outputs data to the outside in accordance with the first and second internal clock signals, respectively. The first and second clock signal lines transmit the first and second internal clock signals to the output buffer, respectively.

The resistance value of the first clock signal line is substantially equal to the resistance value of the second clock signal line.

According to still another aspect of the present invention, there is provided a semiconductor device which includes a delay locked loop circuit generating first and second internal clock signals complementary to each other in accordance with an external clock signal applied from an outside.

The delay locked loop circuit includes a variable delay circuit, a phase adjustment circuit, a delay circuit, and a phase comparison circuit.

The variable delay circuit outputs a third internal clock signal in accordance with the external clock signal. The phase adjustment circuit outputs the first internal clock signal in accordance with the third internal clock signal, and outputs the second internal clock signal having a falling edge equal in phase to a rising edge of the first internal clock signal and having a rising edge equal in phase to a falling edge of the first internal clock signal. The delay circuit receives and delays the first internal clock signal. The phase comparison circuit compares a phase of an output of the delay circuit with a phase of the external clock signal, and outputs a control signal according to a phase difference to the variable delay circuit.

Therefore, the main advantage of the present invention is in that since the potential drops of the power supply potential on the two delay lines are equal, a difference in delay quantity is between the two delay lines is not generated. Due to this, even if only one of the complementary internal clock signals is fed back, it is possible to easily synchronize a data output with an external clock signal.

Another advantage of the present invention is in that since delays caused by clock wirings from the two delay lines to the data output buffer are set equal to each other, it is possible to easily synchronize data outputs with complementary external clock signals, respectively, even if only one of the complementary internal clock signals is fed back.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter in detail with reference to the drawings. It is noted that the same or corresponding constituent elements are denoted by the same reference symbols throughout the drawings.

First Embodiment

Figure 1:
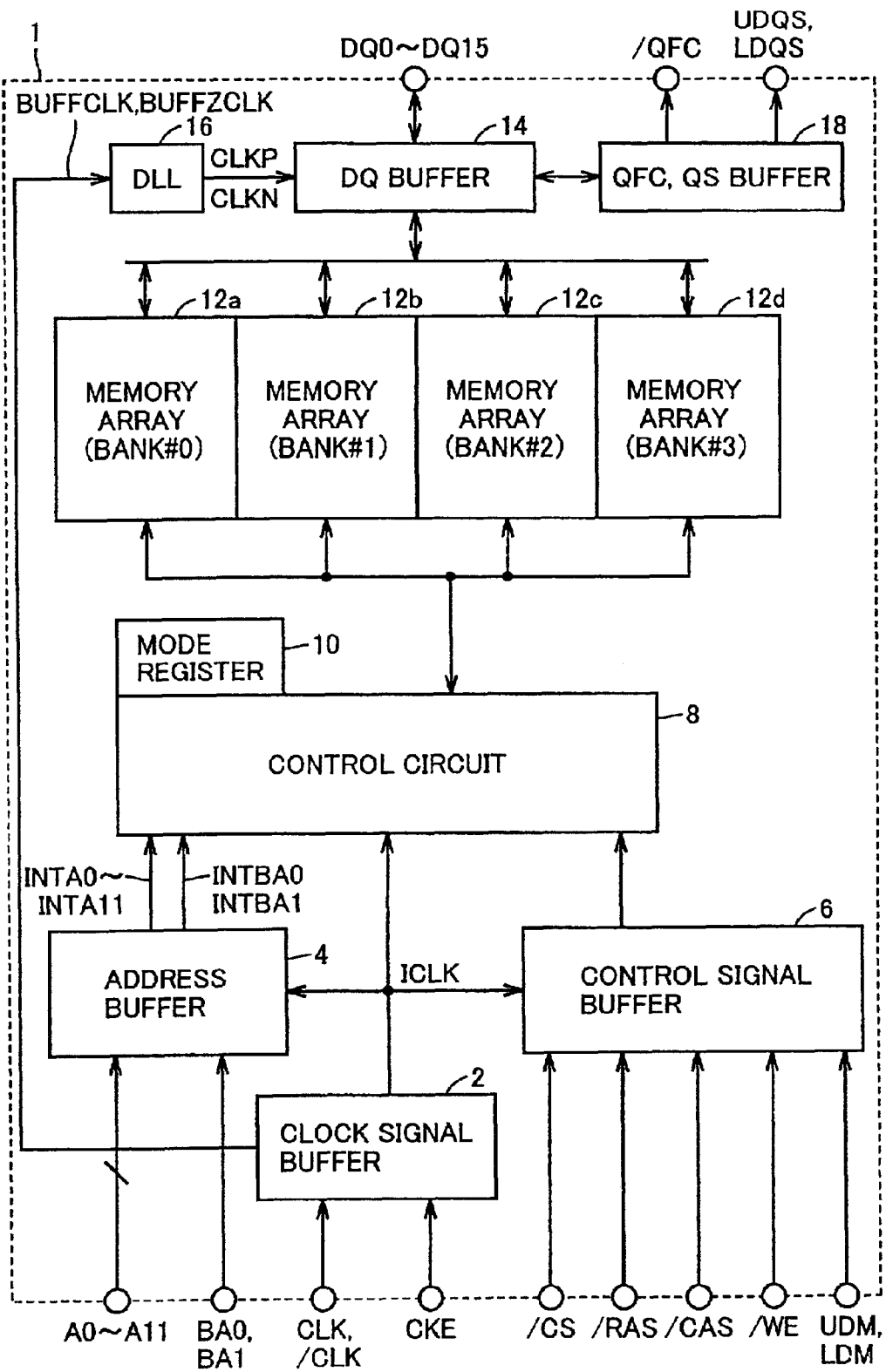
FIG. 1 is a block diagram showing the configuration of a semiconductor device 1 according to the present invention.

FIG. 1 is a block diagram showing the configuration of semiconductor device 1 according to the present invention.

Referring to FIG. 1, semiconductor device 1 includes an address buffer 4 which receives external address signals A0 to A11 and bank address signals BA0 and BA1 and which outputs internal address signals INTA0 to INTA11, INTBA0 and INTBA1, a clock signal buffer 2 which receives external clock signals CLK, /CLK and a clock enable signal CKE and which outputs an internal clock signal ICLK, and a control signal buffer 6 which takes a chip select signal/CS, a row address strobe signal/RAS, a column address strobe signal/CAS, a write enable signal/WE and input and output DQ mask signals UDM and LDM into semiconductor device 1 based on internal clock signal ICLK.

Semiconductor device 1 also includes a control circuit 8 which receives the output of control signal buffer 6, internal clock signal ICLK and internal address signals INTA0 to INTAL1, INTBA0 and INTBA1 and which entirely controls the chip, and a mode register 10 which holds operation mode information in the instruction of control circuit 8 in accordance with the output of control signal buffer 6.

Semiconductor device 1 further includes a DQ buffer 14 which transmits and receives data signals to and from an external data bus, and memory arrays 12a to 12d which hold the data inputted from the outside of semiconductor device 1. Memory arrays 12a to 12d correspond to four banks #0 to #3 which can operate independently of one another, respectively.

Further, semiconductor device 1 includes a DLL circuit 16 which receives external clock signal CLK from clock signal buffer 2 as internal signal BUFFCLK and outputs clock signal CLKP, and which receives external clock signal/CLK therefrom as internal signal BUFFZCLK and outputs clock signal CLKN, and a QFC, QS buffer 18 which outputs control signals/QFC, UDQS and LDQS in accordance with the control timing of DQ buffer 14. DQ buffer 14 receives data output clock signals CLKP and CLKN from DLL circuit 16 and output data in accordance with these clock signals.

Control signal/QFC can be used as a control signal for separating the external data bus from the other constituent elements if a read or write access to DDR SDRAM occurs. Control signals UDQS and LDQS are strobe signals used for a controller to capture the data signals outputted to the external data bus if DDR SDRAM outputs data. Conversely, control signals UDQS and LDQS are inputted from the controller into DDR SDRAM and used for DDR SDRAM to fetch data if the controller writes data to DDR SDRAM.

Figure 2:
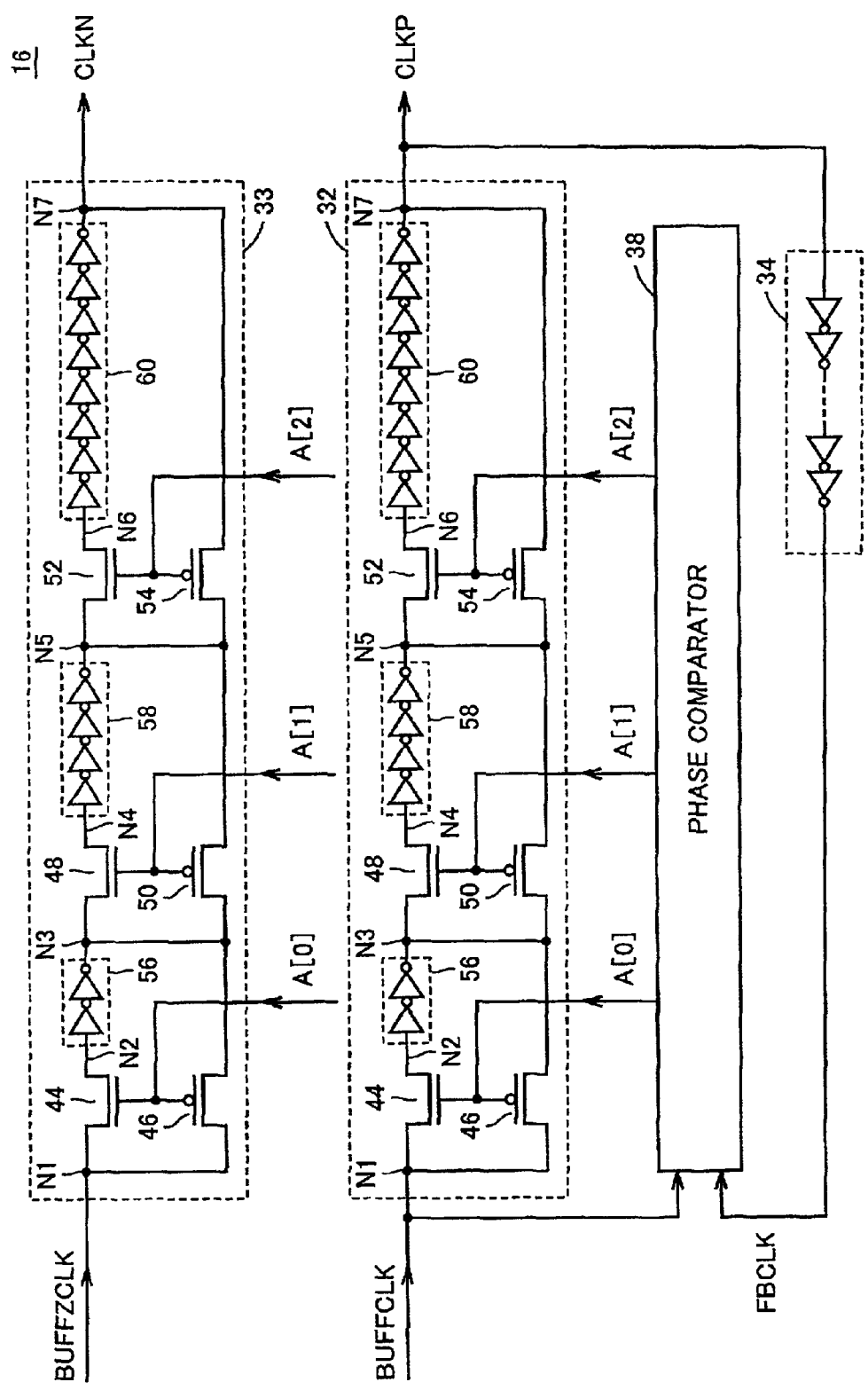
FIG. 2 is a circuit diagram showing the configuration of a DLL circuit 16 shown in FIG. 1.

FIG. 2 is a circuit diagram showing the configuration of DLL circuit 16 shown in FIG. 1.

Referring to FIG. 2, DLL circuit 16 includes a delay line 32 which delays clock signal BUFFCLK and outputs clock signal CLKP, a delay line 33 which delays clock signal BUFFZCLK and outputs clock signal CLKN, a replica buffer 34 which receives clock signal CLKP, which compensates for the delay time of DQ buffer 14 shown in FIG. 1 and serving as an output buffer and which outputs clock signal FBCLK, and a phase comparator 38 which compares the phase of clock signal FBCLK with that of clock signal BUFFCLK and outputs control signals A[0] to A[2].

Delay line 32 receives clock signal BUFFCLK at a node N1. Delay line 32 includes an N-channel MOS transistor 44 which is connected between nodes N1 and N2 and which has a gate receiving control signal A[0], a delay circuit 56 which has an input connected to node N2 and an output connected to a node N3, and a P-channel MOS transistor 46 which is connected between nodes N1 and N3 and which has a gate receiving control signal A[0].

Delay line 32 also includes an N-channel MOS transistor 48 which is connected between nodes N3 and N4 and which has a gate receiving control signal A[1], a delay circuit 58 which has an input connected to node N4 and an output connected to a node N5, and a P-channel MOS transistor 50 which is connected between nodes N3 and N5 and which has a gate receiving control signal A[1].

Delay line 32 further includes an N-channel MOS transistor 52 which is connected between nodes N5 and N6 and which has a gate receiving control signal A[2], a delay circuit 60 which has an input connected to node N6 and an output connected to a node N7, and a P-channel MOS transistor 54 which is connected between nodes N5 and N7 and which has a gate receiving control signal A[2].

Delay circuit 56 includes two inverters connected in series. Delay circuit 58 includes four inverters connected in series. Delay circuit 60 includes eight inverters connected in series.

Replica buffer 34 includes inverters connected in series and each having delay time corresponding to the delay time of DQ buffer 14.

Delay line 33 receives clock signal BUFFZCLK at node N1 and outputs clock signal CLKN from node N7. Since delay line 33 is the same in configuration as delay line 32, the configuration of delay line 33 will not be repeatedly described.

Figure 3:
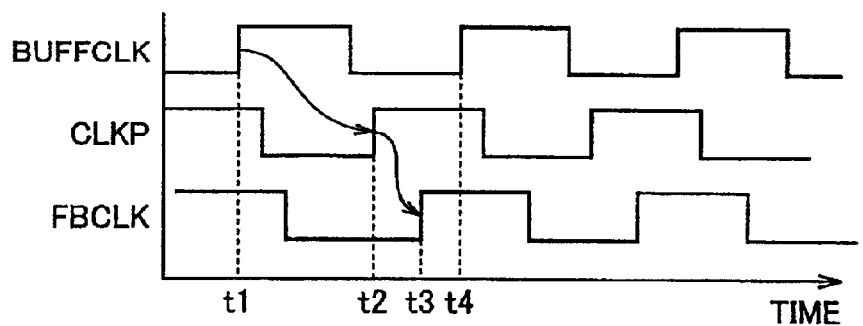
FIG. 3 is the first operating waveform view for explaining the operation of DLL circuit 16 shown in FIG. 2.
Figure 4:
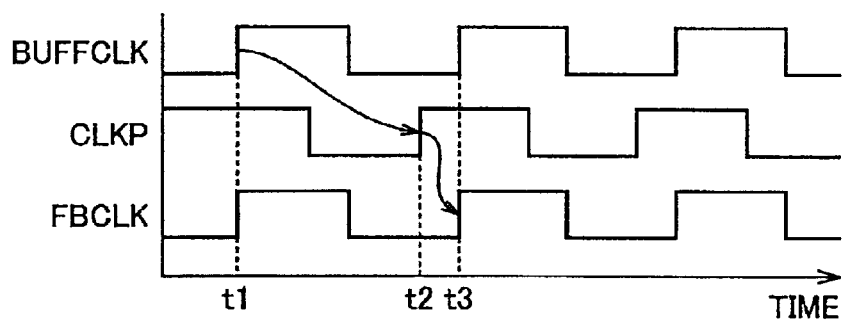
FIG. 4 is the second operating waveform view for explaining the operation of DLL circuit 16 shown in FIG. 2.

FIGS. 3 and 4 are operating waveform views for explaining the operation of DLL circuit 16 shown in FIG. 2.

Referring first to FIGS. 2 and 3, clock signal BUFFCLK rises at time t1 and clock signal CLKP rises at time t2 after the delay time of delay line 32, accordingly.

Time t3 is after time t2 by the delay time of replica buffer 34 for compensating for the delay of the output buffer. At time t3, clock signal FBCLK rises. Phase comparator 38 compares the rise of clock signal FBCLK at time t3 with the rise of clock signal FBCLK at time t4. Phase comparator 38 determines that clock signal FBCLK has an advanced phase from that of clock signal BUFFCLK. As a result, phase comparator 38 changes control signals A[2:0] and increases the delay time of delay line 32.

Referring next to FIGS. 2 and 4, after the delay time of delay line 22 is increased, the delay time from time t1, at which clock signal BUFFCLK rises, to time t2, at which clock signal CLKP rises, increases. At time t3, the rising phase of clock signal BUFFCLK coincides with the rising phase of clock signal FBCLK.

Control signals A[2:0] are obtained after clock signal CLKP is fed back and the phase comparison is made. Control signals A[2:0] are also used to generate clock signal CLKN as they are. Delay line 33 delays clock signal BUFFZCLK in accordance with control signals A[2:0] and generates clock signal CLKN.

Figure 5:
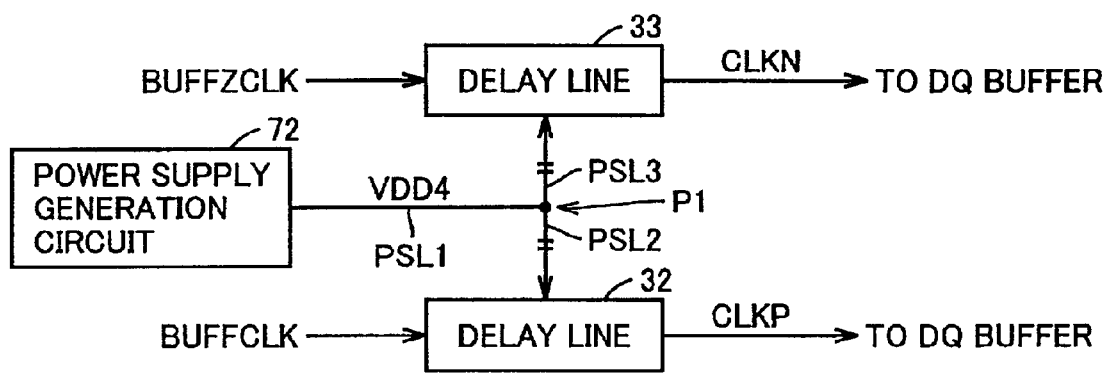
FIG. 5 is an explanatory view for the connection of delay lines 32 and 33 with a power supply generation circuit 72 in the first embodiment according to the present invention.

FIG. 5 is an explanatory view for the connection of delay lines 32, 33 with power supply generation circuit 72.

Referring to FIG. 5, delay lines 32 and 33 are arranged at equivalent positions from power supply generation circuit 72 which generates a power supply for DLL circuit 16 in the first embodiment. More specifically, power supply potential VDD4 generated by power supply generation circuit 72 is supplied to delay lines 32 and 33 through power supply lines PSL1, PSL2 and PSL3. Power supply lines PSL2 and PSL3 are branched from a point P1 on power supply line PSL1. The resistance of power supply line PSL2 is set to be equal to that of power supply line PSL3. For example, if power supply lines PSL2 and PSL3 have an equal width, the lengths thereof are set to be equal to each other.

Figure 6:
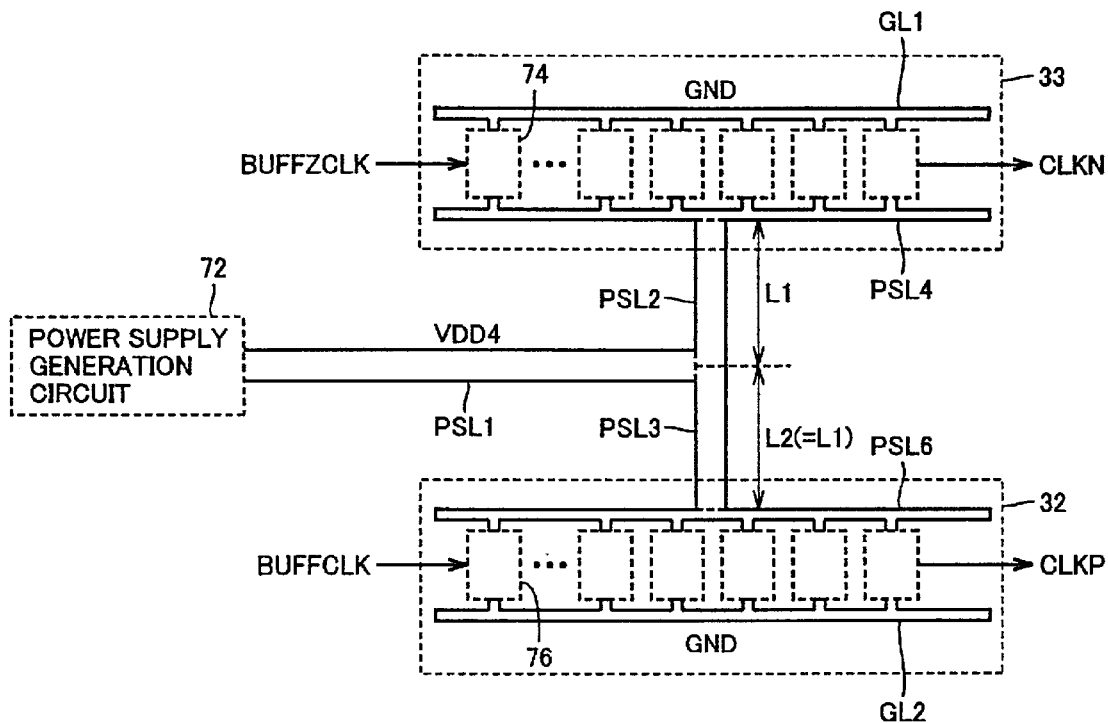
FIG. 6 is an explanatory view showing more concretely the connection of delay lines 32 and 33 with power supply generation circuit 72 shown in FIG. 5.

FIG. 6 shows the connection of the delay lines with the power supply generation circuit shown in FIG. 5 more concretely.

Referring to FIG. 6, power supply potential VDD4 supplied from power supply generation circuit 72 is transmitted first to power supply line PSL1. The tip end portion of power supply line PSL1 is connected to delay line 33 by power supply line PSL2. The length of power supply line PSL2 is L1.

The tip end portion of power supply line PSL is connected to delay line 32 by power supply line PSL3. The length of power supply line PSL3 is L2 which is equal to L1.

Delay line 33 includes a ground line GL1 applied with a ground potential, a power supply line PSL4 applied with power supply potential VDD4, and a plurality of unit cells 74. The approximately central portion of power supply line PSL4 is connected to power supply line PSL2. Power supply line PSL4 is arranged in parallel to ground line GL1. Unit cells 74 are aligned between power supply line PSL4 and ground line GL1. Each unit cell 74 is connected to power supply line PSL4 and ground line GL1.

Unit cells 74 are inverters included in delay circuits 56, 58 and 60 shown in FIG. 2. Although not shown in FIG. 6, the transmission gates of N-channel MOS transistors 44, 48 and 52, P-channel MOS transistors 46, 50 and 54, and the like shown in FIG. 2 are arranged between the inverters.

In delay line 33, unit cell 74 in the first stage receives clock signal BUFFZCLK and unit cell 74 in the final stage outputs clock signal CLKN.

Delay line 32 includes a ground line GL2 applied with the ground potential, a power supply line PSL6 applied with power supply potential VDD4, and a plurality of unit cells 76. The approximately central portion of power supply line PSL6 is connected to power supply line PSL3. Power supply line PSL6 is arranged in parallel to ground line GL2. Unit cells 76 are aligned between power supply line PSL6 and ground line GL2. Each unit cell 76 is connected to power supply line PSL6 and ground line GL2.

Unit cells 76 are inverters included in delay circuits 56, 58 and 60 shown in FIG. 2. Although not shown in FIG. 6, the transmission gates of N-channel MOS transistors 44, 48 and 52, P-channel MOS transistors 46, 50 and 54, and the like shown in FIG. 2 are arranged between the inverters.

In delay line 32, unit cell 76 in the first stage receives clock signal BUFFCLK and unit cell 76 in the final stage outputs clock signal CLKP.

By adopting the configurations of the power supply lines stated above, even if the power supply potential supplied to the delay lines is lowered by the resistances of power supply interconnections, the resistance values of the power supply interconnections are equal and the decrease quantities of the power supply potential are equal among the power supply interconnections. Due to this, almost the same power supply potential is supplied to delay lines 32 and 33. Since two delay lines 32 and 33 are the same in circuit configuration, delay lines 32 and 33 delay clock signals BUFFCLK and BUFFZCLK by an equal delay quantity, respectively. It is, therefore, possible to make the phase of data output clock signal CLKP coincident with that of external clock signal CLK and to make the phase of data output clock signal CLKN coincident with that of external clock signal/CLK.

Consequently, by arranging the DLL circuit and the power supply interconnections as shown in the first embodiment, it is possible to easily synchronize the data output in response to clock signal CLKP and the data output in response to clock signal CLKN with external clock signals CLK and /CLK, respectively even if only clock signal CLKP is fed back to DLL circuit 16.

Second Embodiment

Figure 7:
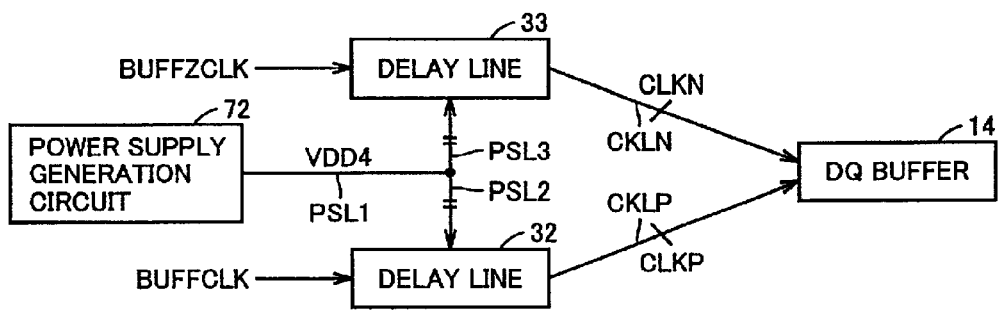
FIG. 7 is an explanatory view for the arrangement of delay lines, a power supply generation circuit and a DQ buffer in the second embodiment according to the present invention.

FIG. 7 is an explanatory view for the arrangement of delay lines, a power supply generation circuit and a DQ buffer in the second embodiment.

Referring to FIG. 7, a clock interconnection CKLN which transmits clock signal CLKN from delay line 33 to DQ buffer 14, and a clock interconnection CKLP which transmits clock signal CLKP from delay line 32 to DQ buffer 14 in addition to power supply lines PSL1 to PSL3 described in the first embodiment with reference to FIG. 5 are used in the second embodiment.

Figure 22:
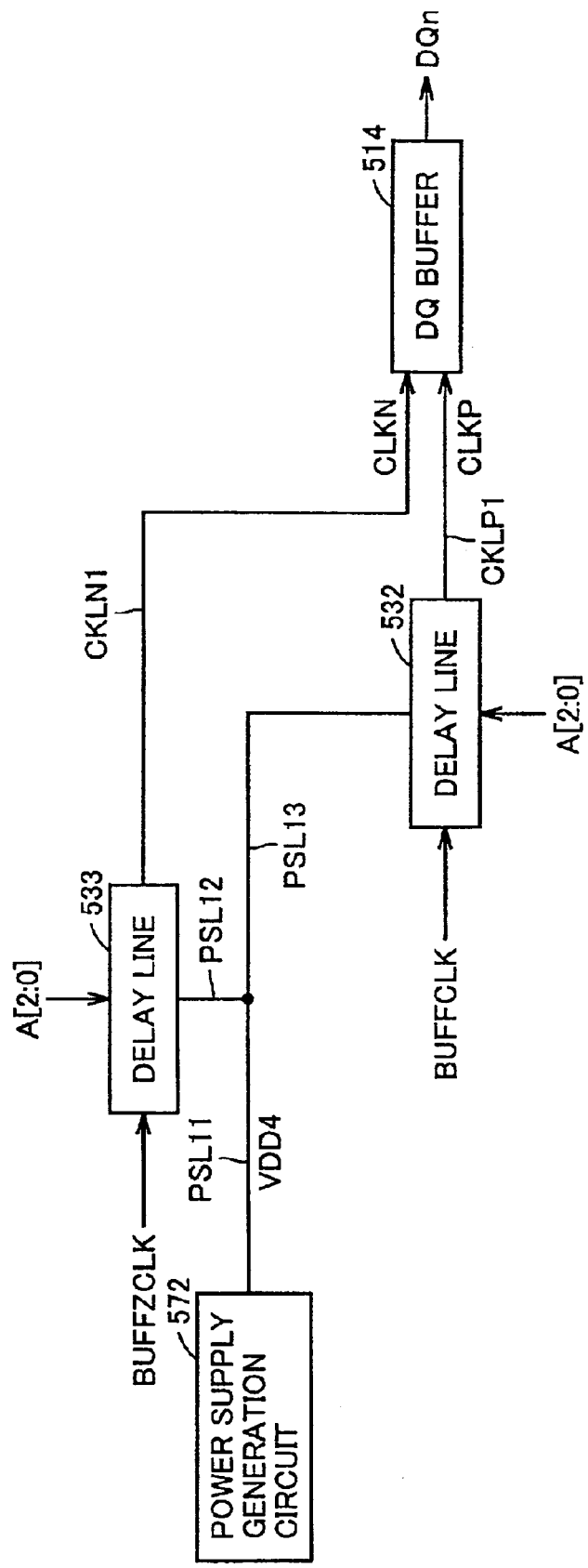
FIG. 22 is an explanatory view for the problem of the conventional DLL circuit.

Clock interconnections CKLN and CKLP are equal in length. Due to this, it is possible to set the propagation delay time of clock signal CLKN propagated from delay line 33 to DQ buffer 14 equal to the propagation delay time of clock signal CLKP propagated from delay line 32 to DQ buffer 14. By doing so, it is possible to further improve the shift of the phase difference resulting from clock lines CKLN1 and CKLP1 different in length as shown in FIG. 22.

In the second embodiment, the delay lines of the DLL circuit as well as the power supply lines and clock lines are arranged as shown in FIG. 7. By dong so, even if only one clock signal CLKP is fed back, it is possible to make the phases of complementary data output clock signals coincident with each other and to synchronize data outputs with external clock signals CLK and /CLK, respectively.

Third Embodiment

In the third embodiment, the inverters included in delay line 32 and those included in delay line 33 are alternately arranged between a pair of a power supply line and a ground line.

Figure 8:
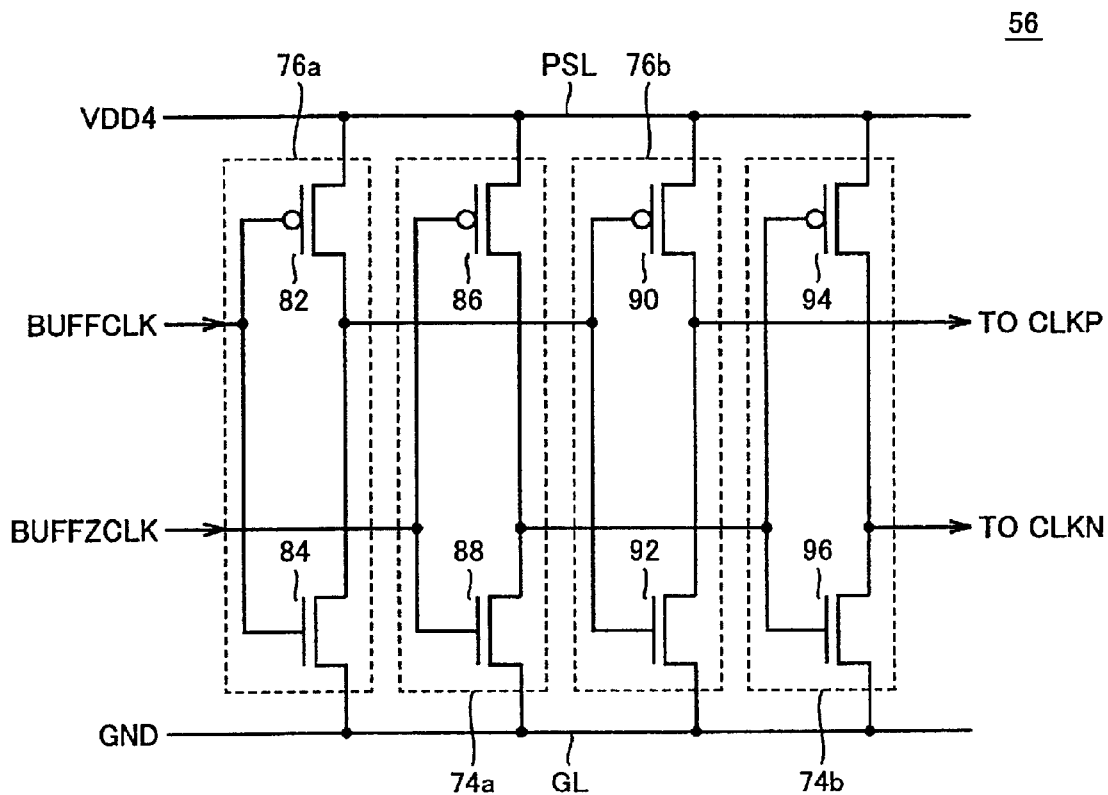
FIG. 8 shows that the present invention is applied to a delay circuit 56 shown in FIG. 2.

FIG. 8 shows that the present invention is applied to delay circuit 56 shown in FIG. 2.

In FIG. 8, inverters 74a and 74b which form a part of delay line 33 and inverters 76a and 76b which form a part of delay line 32 are shown. Inverter 76a receives and inverts clock signal BUFFCLK. Inverter 76b receives and inverts the output of inverter 76a and transmits a signal to a group of unit cells which output clock signal CLKP.

Inverter 74a receives and inverts clock signal BUFFZCLK and outputs the inverted signal to inverter 74b. Inverter 74b receives and inverts the output of inverter 74a and transmits a signal to the unit cell group which outputs clock signal CLKN.

Inverter 76a includes a P-channel MOS transistor 82 and an N-channel MOS transistor 84 which are connected in series between a power supply line PSL and a ground line GL. Both of P-channel MOS transistor 82 and N-channel MOS transistor 84 receive clock signal BUFFCLK at their gates.

Inverter 74a includes a P-channel MOS transistor 86 and an N-channel MOS transistor 88 which are connected in series between power supply line PSL and ground line GL. Both of P-channel MOS transistor 86 and N-channel MOS transistor 88 receive clock signal BUFFCLK at their gates.

Inverter 76b includes a P-channel MOS transistor 90 and an N-channel MOS transistor 92 which are connected in series between power supply line PSL and ground line GL. Both of the gates of P-channel MOS transistor 90 and N-channel MOS transistor 92 are connected to the drain of P-channel MOS transistor 82.

Inverter 74b includes a P-channel MOS transistor 94 and an N-channel MOS transistor 96 which are connected in series between power supply line PSL and ground line GL. Both of the gates of P-channel MOS transistor 94 and N-channel MOS transistor 96 are connected to the drain of P-channel MOS transistor 86.

Likewise, the inverter groups included in delay circuits 58 and 60 shown in FIG. 2 may be arranged so that the inverters included in delay line 32 and the inverters included in delay line 33 are alternately arranged.

By thus arranging the inverter groups, even if the power supply level is lowered by the resistances and the power supplies applied by delay circuits 56, 58 and 60 differ, the power supply levels of the respective delay circuits are almost equal between the two delay lines. Due to this, the delay quantities of clock signal BUFFCLK in the respective delay circuits and those of clock signal BUFFZCLK in the respective delay circuits become equal. It is, therefore, possible to make the phases of outputted clock signals CLKP and CLKN coincident with those of external clock signals CLK and /CLK, respectively.

Consequently, by arranging the inverter groups in the respective delay circuits constituting the delay lines included in the DLL circuit as shown in the third embodiment, it is possible to easily synchronize data outputs with external clock signals CLK and /CLK, respectively even if only clock signal CLKP is fed back.

Fourth Embodiment

Figure 9:
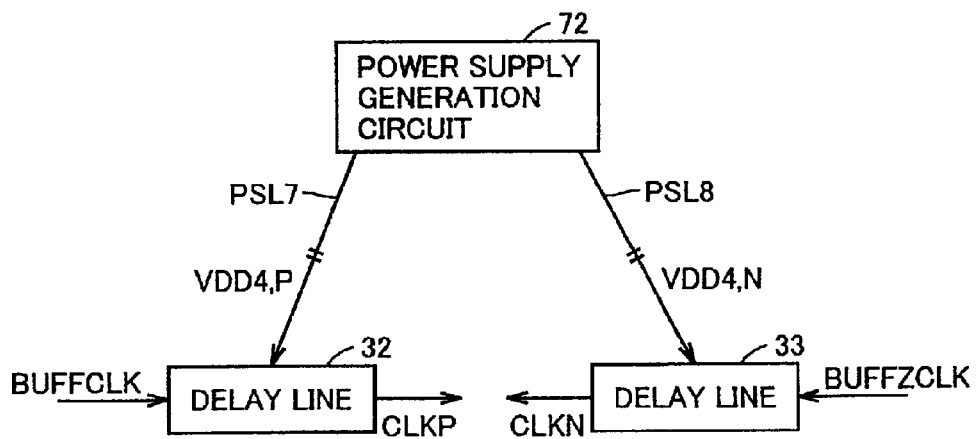
FIG. 9 shows the arrangement of a DLL power supply generation circuit 72 and delay lines 32 and 33 in the fourth embodiment according to the present invention.

FIG. 9 shows the arrangement of power supply generation circuit 72 for the DLL circuit and delay lines 32 and 33 in the fourth embodiment.

Referring FIG. 9, in the fourth embodiment, power supply generation circuit 72 which generates power supply potential VDD4 for the DLL circuit is arranged equivalently from delay line 32 which outputs clock signal CLKP and delay line 33 which outputs clock signal CLKN. By thus arranging power supply generation circuit 72, it is possible to set the length of a power supply line PSL7 which outputs power supply potential VDD4 from power supply generation circuit 72 toward delay line 32 equal to that of a power supply line PSL8 which outputs power supply potential VDD4 from power supply generation circuit 72 toward delay line 33.

By doing so, even if the potential level of the potential supplied to the delay line is lowered by the resistances of the power supply lines, almost an equal power supply potential is supplied to delay lines 32 and 33. Since the two delay lines are the same in circuit configuration, the delay quantity of clock signal BUFFCLK and that of clock signal BUFFZCLK are equal. In addition, it is possible to make the phase of clock signal CLKP coincident with that of external clock signal CLK and the phase of clock signal CLKN coincident with that of external clock signal/CLK.

Consequently, by arranging the two delay lines and the power supply generation circuit as shown in FIG. 9, it is possible to easily synchronize data outputs wit external clock signals CLK and /CLK, respectively even if only clock signal CLKP is fed back.

Fifth Embodiment

In the fifth embodiment, RC delay circuits are employed in place of the delay circuits each consisting of the inverters connected in series as shown in FIG. 2.

Figure 10:
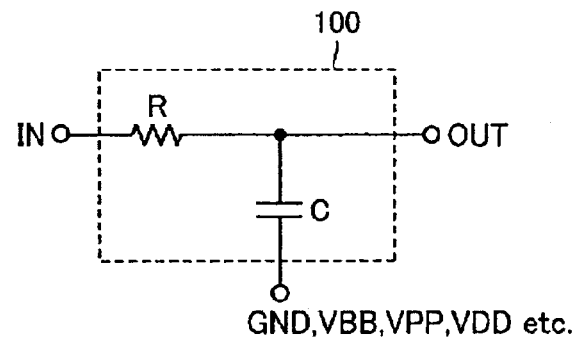
FIG. 10 is a circuit diagram for explaining an RC delay circuit 100.

FIG. 10 is a circuit diagram for explaining an RC delay circuit 100.

Referring to FIG. 10, RC delay circuit 100 includes a resistor R, which is connected between an input node IN and an output node OUT, and a capacitor C, which is connected between output node OUT and a constant-potential node. The constant potential node is connected to a power supply potential which is a constant potential such as a ground potential GND, a substrate potential VBB, a boosted potential VPP or an internal power supply potential VDD.

The delay quantity of the RC delay circuit is not influenced by the change of power supply potential VDD4 for the DLL circuit. Therefore, the delay quantity of clock signal BUFFCLK becomes equal to that of clock signal BUFFZCLK.

Resistor R can be realized by a resistance of interconnections formed on a semiconductor substrate, a diffused resistor in an impurity region formed on the semiconductor substrate or the like.

In addition, capacitor C can be realized by a junction capacitance, the capacitance between a transistor gate and a substrate or a capacitance formed by holding an insulator between polysilicon electrodes.

Figure 11:
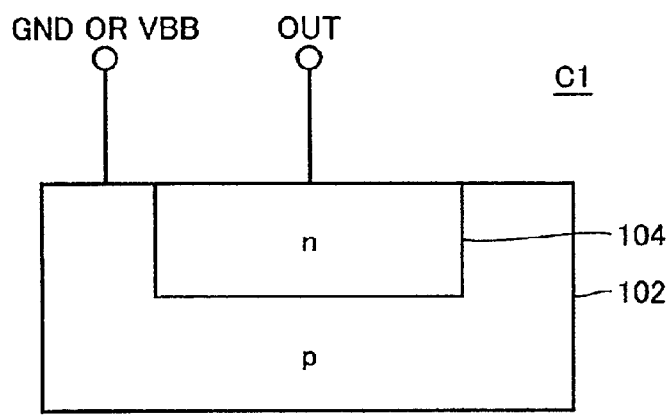
FIG. 11 is a cross-sectional view for explaining a capacitor C1 realized by a junction capacitance.

FIG. 11 is a cross-sectional view for explaining a capacitor C1 realized by a junction capacitance.

Referring to FIG. 11, an N-type impurity region 104 is formed on the main surface of a P-type substrate 102. In this case, output node OUT shown in FIG. 10 is connected to impurity region 104 and substrate 102 is connected to a fixed potential, such as ground potential or substrate potential VBB, which is lower than the potential of output node OUT. As a result, impurity region 104 is opposite in bias to substrate 102 and a junction capacitance can be used as a capacitor.

Figure 12:
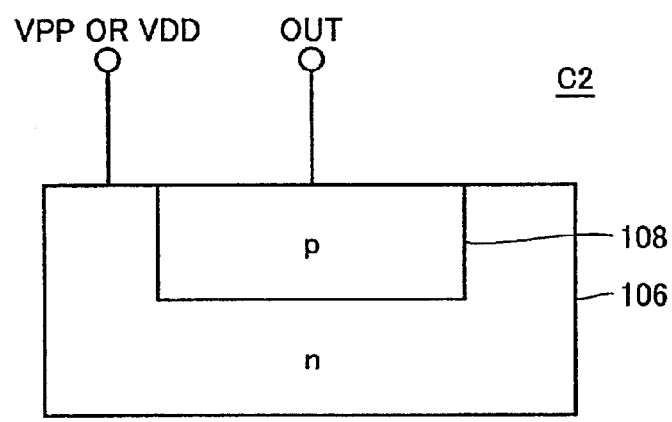
FIG. 12 is a cross-sectional view for explaining a capacitor C2 realized by a junction capacitance.

FIG. 12 is a cross-sectional view for explaining a capacitor C2 realized by a junction capacitance.

Referring to FIG. 12, a P-type impurity region 108 is formed on the main surface of an N-type substrate 106. In this case, output node OUT shown in FIG. 10 is connected to impurity region 108 and substrate 106 is connected to a fixed potential, such as ground potential or substrate potential, which is lower than the potential of output node OUT. As a result, the impurity region 108 is opposite in bias to substrate 106 and a junction capacitance can be used as a capacitor.

Figure 13:
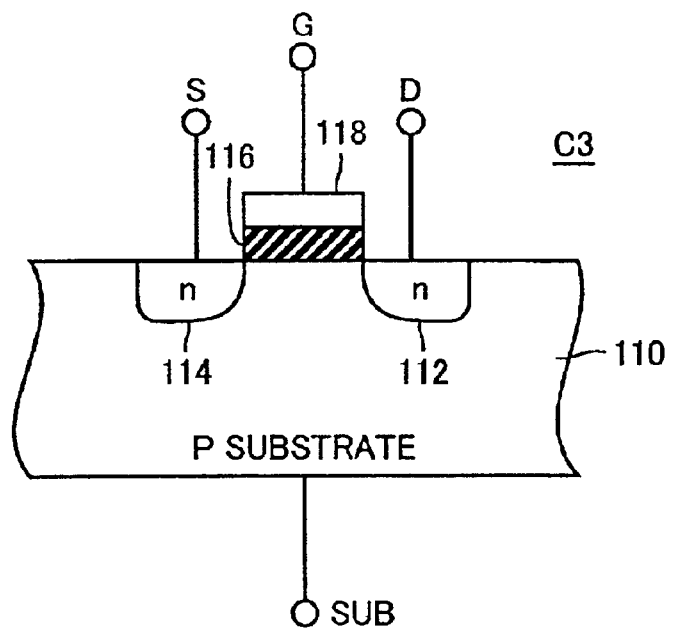
FIG. 13 is an explanatory view for a capacitor C3 realized by a transistor.

FIG. 13 is a cross-sectional view for explaining a capacitor C3 realized by a transistor.

Referring to FIG. 13, N-type impurity regions 114 and 112 are formed on a substrate 110, a gate oxide film 116 is formed on the region between impurity regions 114 and 112 and an electrode 118 made of polysilicon is formed on gate oxide film 116. Gate oxide film 116 is very thin. Due to this, if gate electrode 118 is used as one electrode and substrate 110 is used as the other electrode, a capacitor can be formed.

Figure 14:
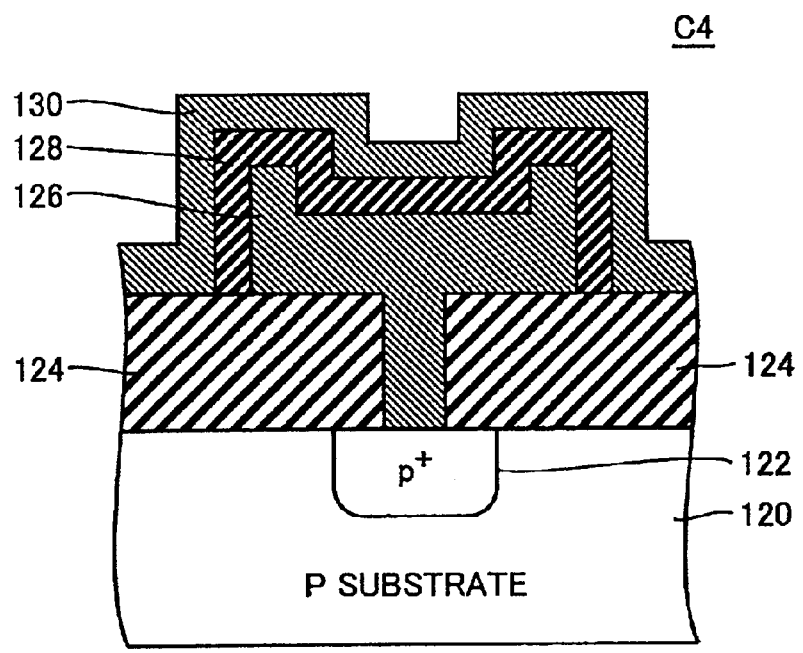
FIG. 14 is a cross-sectional view for explaining a capacitor C4 formed on an interlayer insulating film which covers a semiconductor substrate.

FIG. 14 is a cross-sectional view for explaining a capacitor C4 formed on an interlayer insulating film covering a semiconductor substrate.

Referring to FIG. 14, a P-type impurity region 122 is formed on the main surface of a P substrate 120 and an interlayer insulating film 124, in which a contact hole connected to impurity region 122 is formed, is formed on substrate 120. The first electrode 126 is formed on interlayer insulating film 124. This first electrode 126 is connected to impurity region 122 through the contact hole formed in interlayer insulating film 124. An insulating layer 128 is formed to cover first electrode 126. The second electrode 130 is formed on insulating layer 128.

Capacitor C4 can be formed in the same steps as those of, for example, the capacitor of a DRAM memory cell.

As stated above, by employing RC delay elements as the delay circuits in the DLL circuit, it is possible to easily synchronize data outputs with external clock signals CLK and /CLK, respectively even if only clock signal CLK is fed back.

Sixth Embodiment

Figure 15:
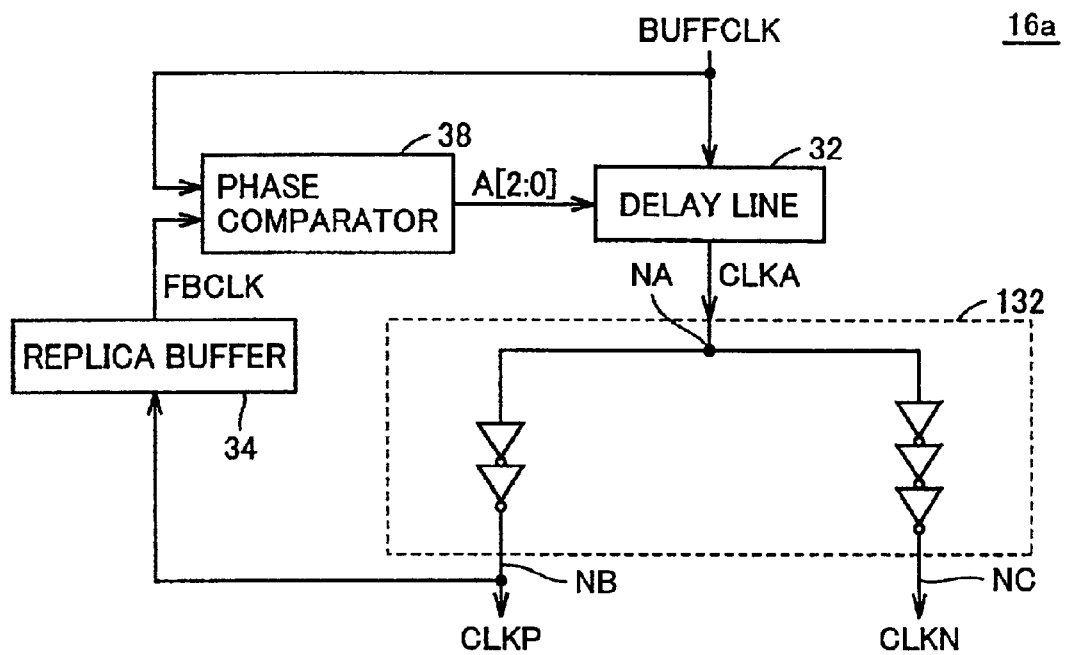
FIG. 15 shows the configuration of a section used as the delay line of the DLL circuit in the first embodiment.

FIG. 15 is a block diagram of a DLL circuit in which a section used as a delay line is used in the first embodiment.

Referring to FIG. 15, a DLL circuit 16a employed in the sixth embodiment includes a phase splitter 132 instead of delay line 33 in DLL circuit 16 shown in FIG. 2. A clock signal CLKA outputted from delay line 32 is applied to the node NA of phase splitter 132 and phase splitter 132 outputs clock signal CLKP from a node NB. In addition, phase splitter 132 outputs clock signal CLKN from an output node NC.

As can be seen, in the sixth embodiment, phase splitter 132 is arranged in DLL circuit 16a, only clock signal BUFFCLK is delayed and clock signals CLKP and CLKN are generated based on delayed clock signal BUFFCLK.

Figure 16:
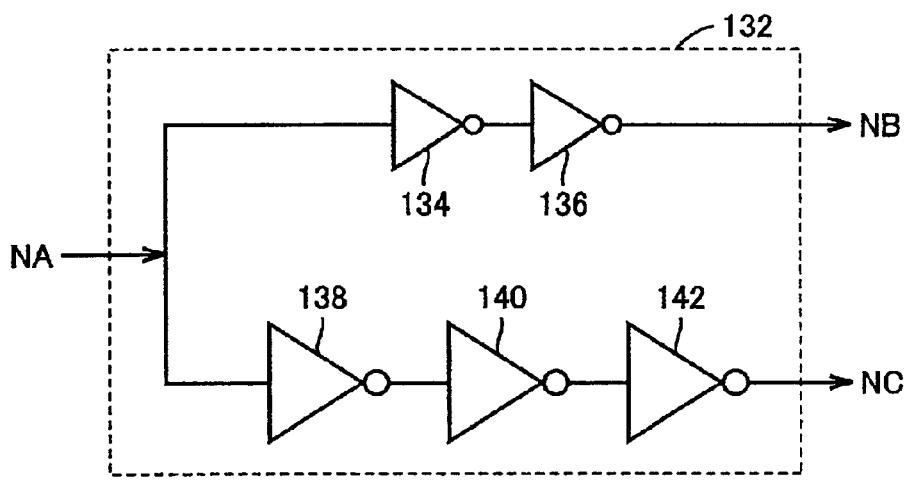
FIG. 16 is a circuit diagram for explaining a phase splitter 132 shown in FIG. 15.

FIG. 16 is a circuit diagram for explaining phase splitter 132 shown in FIG. 15.

Referring to FIG. 16, phase splitter 132 includes an inverter 134 which has an input connected to input node NA and an inverter 136 which receives and inverts the output of inverter 134 and outputs a signal to output node NB.

Phase splitter 132 also includes an inverter 138 which has an input connected to input node NA, an inverter 140 which receives the output of inverter 138 and an inverter 142 which receives the output of inverter 140. Inverter 142 outputs a signal to node NC.

Here, the sizes of the respective inverters are set so that the sum of the delay time of inverters 134 and 136 is equal to that of inverters 138 to 142. To be specific, the sizes of inverters 138 to 142 are set larger than those of inverters 134 and 136 so that the delay time of the two inverters is equal to that of the three inverters.

Figure 17:
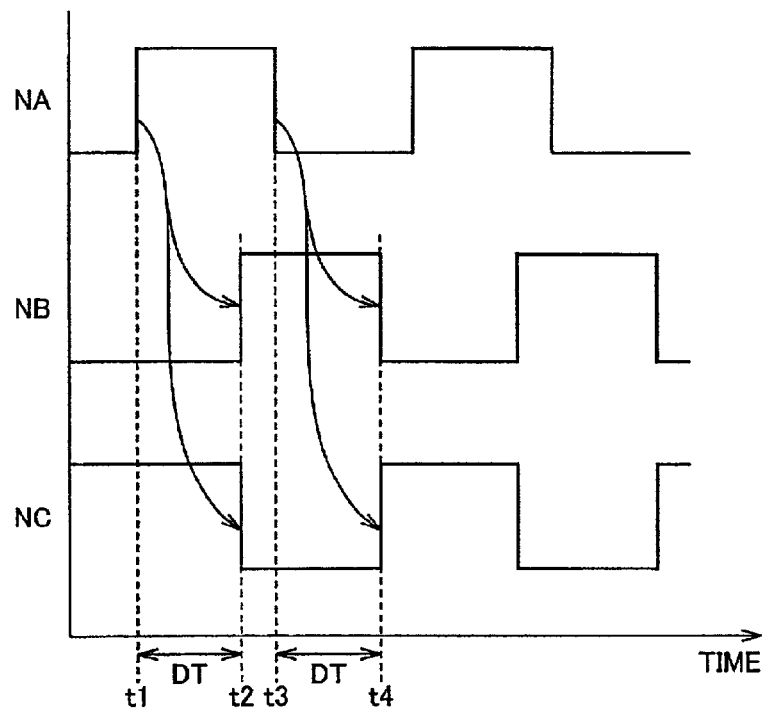
FIG. 17 is an operating waveform view for explaining the operation of the phase splitter shown in FIG. 16.

FIG. 17 is an operating waveform view for explaining the operation of phase splitter 132 shown in FIG. 16.

Referring to FIGS. 16 and 17, a signal is inputted into input node NA. The rise of the signal at time t1 is transmitted to node NB after delay time DT. Since the number of inverters from node NA to node NB is two, the signal has a normally rotated waveform.

On the other hand, the waveform of the signal inputted into node NA after the same delay time DT is transmitted to node NC. Since the number of inverters from node NA to node NC is three, the waveform is inverted. Therefore, the rising edge of the signal at node NA at time t1 becomes a rising edge at node NB at time t2 and becomes a falling edge at node NC at time t2.

Likewise, the falling edge of the signal at node NA at time t3 is transmitted to nodes NB and NC at time t4.

As stated above, in the sixth embodiment, only one delay line 32 is used. Due to this, even if the level of the power supply generated for DLL is changed, it is possible to hold the phase difference between a data output by clock signal CLKP and a data output by clock signal CLKN exactly at 180° by feeding back only clock signal CLKP.

Seventh Embodiment

Figure 18:
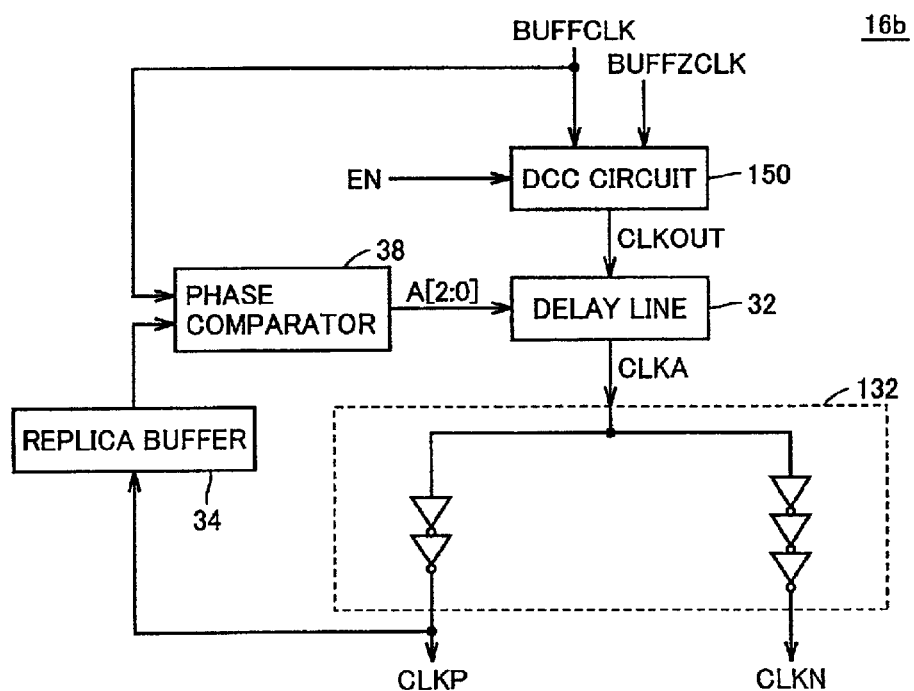
FIG. 18 is a block diagram showing the configuration of a DLL circuit 16b in the seventh embodiment according to the present invention.

FIG. 18 is a block diagram showing the configuration of a DLL circuit 16b in the seventh embodiment.

Referring to FIG. 18, DLL circuit 16b includes a DCC circuit 150 which shapes a clock signal waveform applied to the delay line in the configuration of DLL circuit 16a shown in FIG. 15. The remaining constituent elements of DLL circuit 16b are the same as those of DLL circuit 16a shown in FIG. 15 and will not be repeatedly described herein.

The ratio of the pulse duration of a clock signal to the pulse interval thereof is referred to as a duty cycle, a duty factor, an impact factor or the like. If a duty cycle is deviated from 50% and clock signals CLKP and CLKN based only on clock signal BUFFCLK without using clock signal BUFFZCLK unlike DLL circuit 16a shown in FIG. 15, data are not outputted at equal intervals. It is, therefore, desirable to correct the duty cycle.

DCC circuit 150 corrects the duty cycle back to 50% if the duty cycle of each of inputted clock signals BUFFCLK and BUFFZCLK is deviated from 50%. DCC circuit 150 outputs a clock signal CLKOUT which is activated in response to an enable signal EN and of which waveform is reshaped, to delay line 32.

Figure 19:
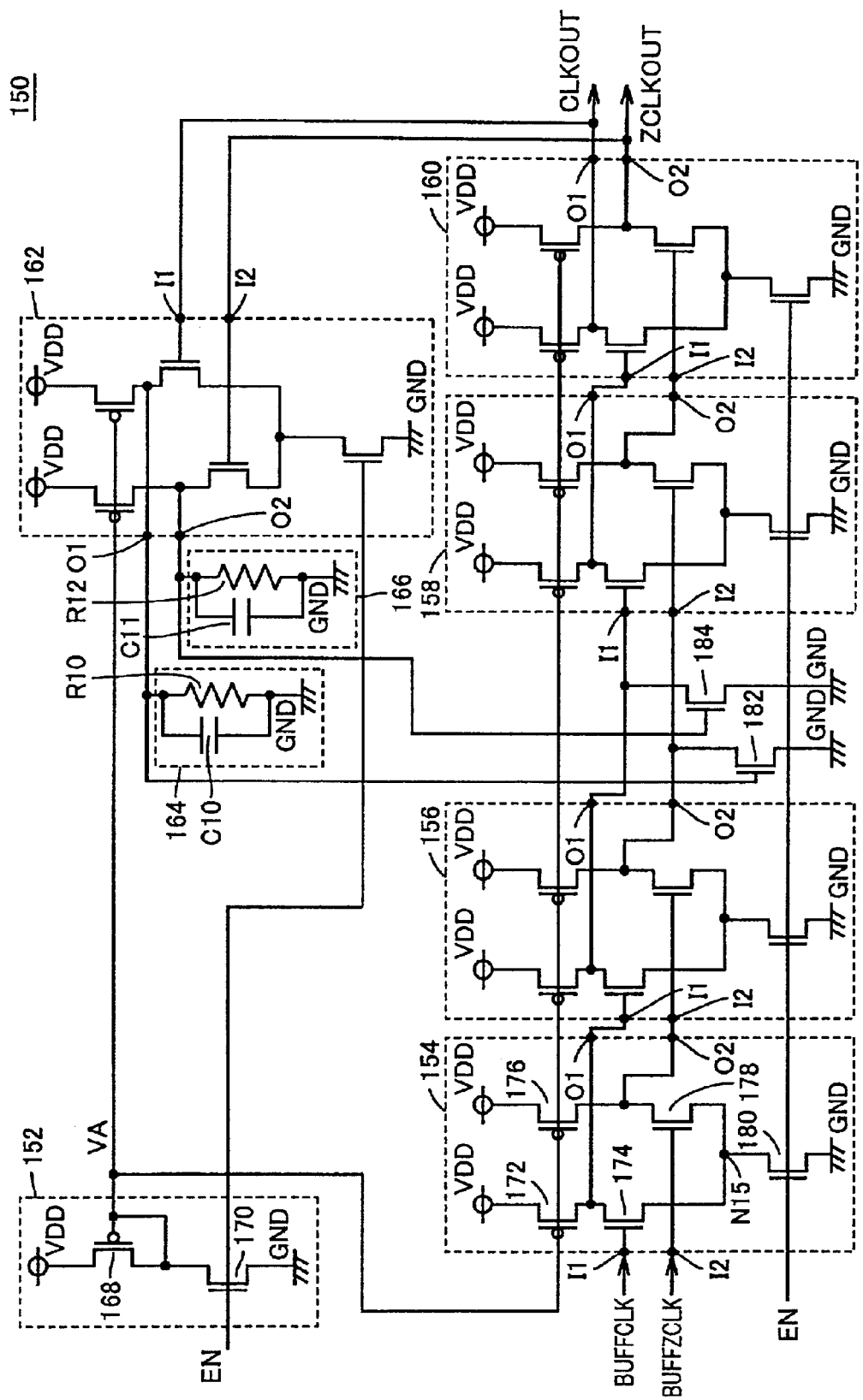
FIG. 19 is a circuit diagram showing the configuration of a DCC circuit 150 shown in FIG. 18.

FIG. 19 is a circuit diagram showing the configuration of DCC circuit 150 shown in FIG. 18.

Referring to FIG. 19, DCC circuit 150 includes a bias circuit 152 which outputs a bias potential VA in accordance with enable signal EN, and inverter circuits 154 to 162 which are connected in series and which receive clock signals BUFFCLK and BUFFZCLK and which output complementary inverted outputs.

Clock signal BUFFCLK is applied to the input node I1 of inverter circuit 154. Clock signal BUFFZCLK is applied to the input node I2 of inverter circuit 154. Output node O1 of inverter circuit 154 is connected to input node I1 of inverter circuit 156. Output node O2 of inverter circuit 154 is connected to input node I2 of inverter circuit 156.

Output node O1 of inverter circuit 156 is connected to input node I1 of inverter circuit 158. Output node O2 of inverter circuit 156 is connected to input node I2 of inverter circuit 158. Output node O1 of inverter circuit 158 is connected to input node I1 of inverter circuit 160. Output node O2 of inverter circuit 158 is connected to input node I2 of inverter circuit 160.

Output node O1 of inverter circuit 160 is connected to input node I1 of inverter circuit 162. Output node O2 of inverter circuit 160 is connected to input node I2 of inverter circuit 162. Clock signal CLKOUT is outputted from output node O1 of inverter circuit 160. A clock signal ZCLKOUT is outputted from output node O2 of inverter circuit 160. Out of these complementary clock signals CLKOUT and ZCLKOUT, clock signal CLKOUT is applied to delay line 32 shown in FIG. 18.

Further, DCC circuit 150 includes an RC circuit 164 which is connected to output node O1 of inverter circuit 162, an RC circuit 166 which is connected to output node O2 of inverter circuit 162, an N-channel MOS transistor 184 which is connected between output node O1 of inverter circuit 156 and a ground node and which has a gate connected to output node O2 of inverter circuit 162, and an N-channel MOS transistor 182 which is connected between output node O2 of inverter circuit 156 and the ground node and which has a gate connected to output node O1 of inverter circuit 162.

Bias circuit 162 includes a P-channel MOS transistor 168 and an N-channel MOS transistor 170 which are connected in series between a power supply node applied with a power supply potential VDD and the ground node. The gate of N-channel MOS transistor 170 receives enable signal EN. The gate of P-channel MOS transistor 168 is connected to the drain thereof.

Inverter circuit 154 includes a P-channel MOS transistor 172 which is connected between the power supply node and output node O1 and which has a gate connected to bias potential VA, an N-channel MOS transistor 174 which is connected between output node O1 and a node N15 and which has a gate connected to input node I1, a P-channel MOS transistor 176 which is connected between the power supply node and output node O2 and which has a gate connected to bias potential VA, an N-channel MOS transistor 178 which is connected between output node O2 and a node N15 and which has a gate connected to input node I2, and an N-channel MOS transistor 180 which is connected between node N15 and the ground node and which has a gate receiving enable signal EN.

Since the configurations of inverter circuits 156 to 162 are the same as the configuration of inverter circuit 154, they will not be repeatedly described herein.

RC circuit 164 includes a resistor R10 and a capacitor C10 which are connected in series between output node O1 of inverter circuit 162 and the ground node. RC circuit 166 includes a resistor R12 and a capacitor C11 which are connected between output node O2 of inverter circuit 162 and the ground node.

Figure 20:
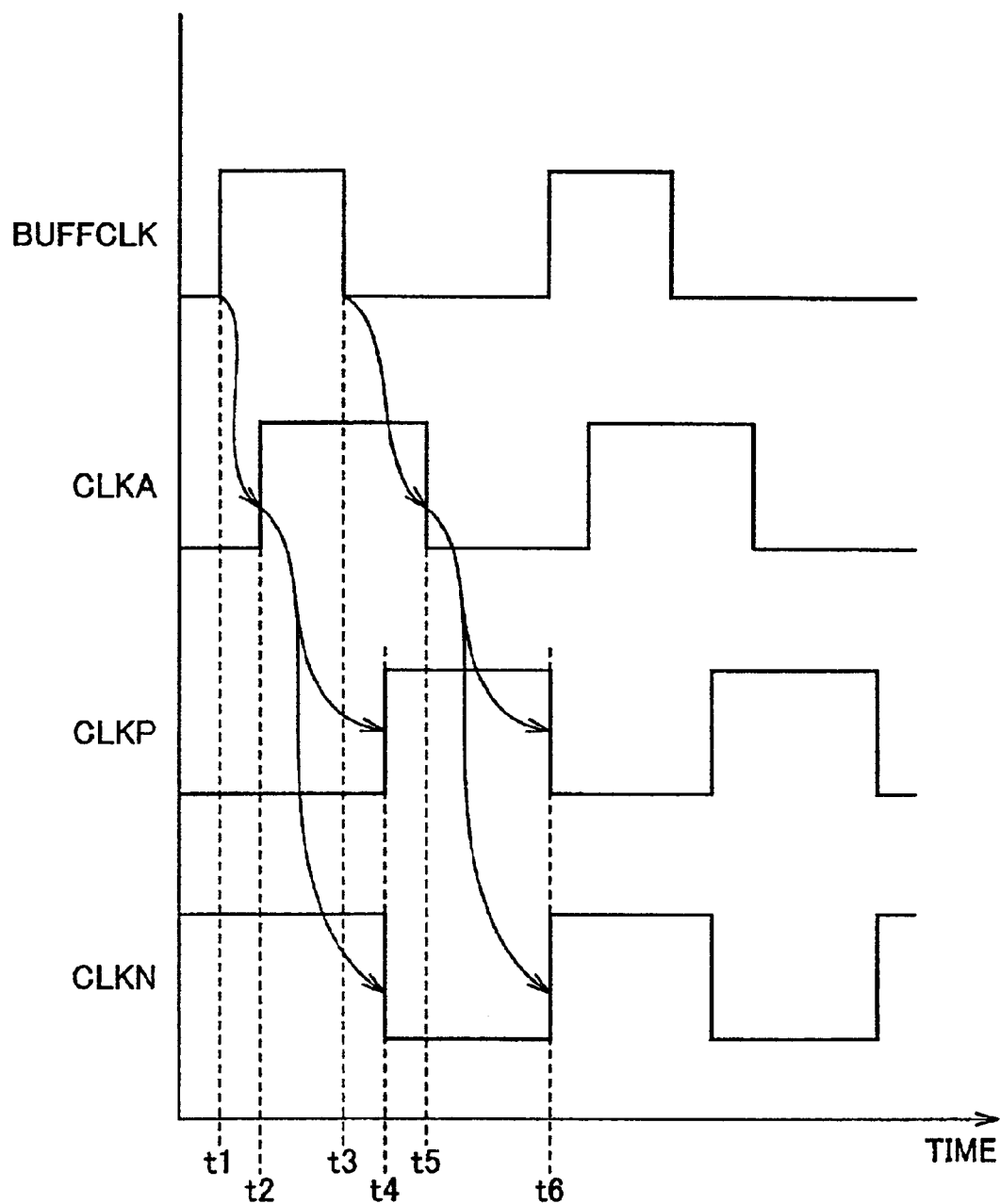
FIG. 20 is an operating waveform view for explaining the operation of DLL circuit 16b shown in FIG. 18.
Figure 21:
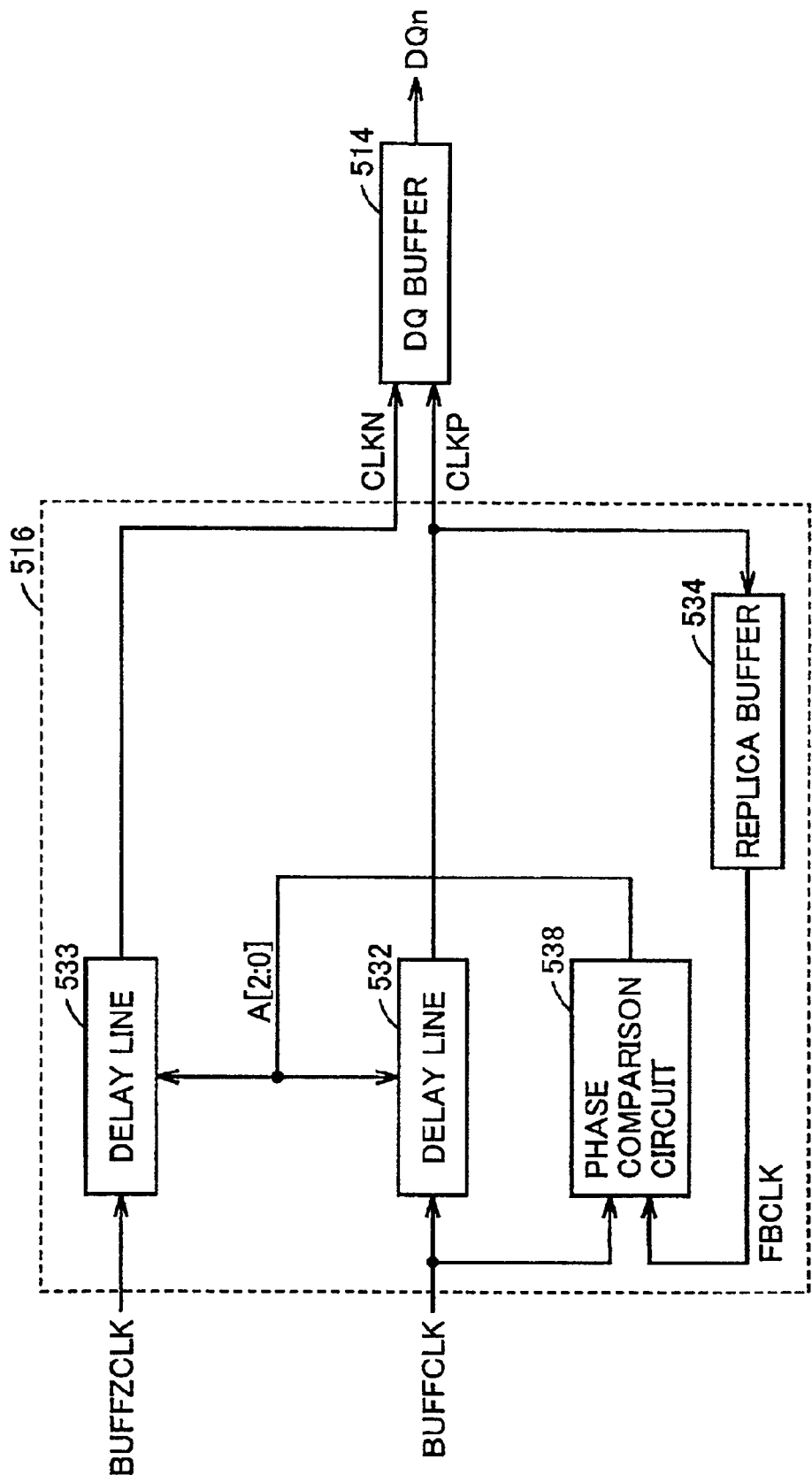
FIG. 21 is a block diagram for explaining conventional DLL circuit 516.

FIG. 20 is an operating waveform view for explaining the operation of DLL circuit 16b shown in FIG. 18.

Referring to FIGS. 18 and 20, the rising edge of clock signal BUFFCLK at time t1 is outputted as the rising edge of clock signal CLKA from DCC circuit 150 at time t2. In addition, the falling edge of clock signal BUFFCLK at time t3 is outputted as the falling edge of clock signal CLKA at time t5. In this way, by setting the delay time of the rising edge and the delay time of the falling edge to be different from each other, DCC circuit 150 makes the duty cycle of clock signal CLKA outputted from DCC circuit 150 closer to 50%.

The reason for providing DCC circuit 150 will be described. It is only the rising edge of each of clock signals CLKP and CLKN that determines the data output timing of the DQ buffer.

Due to this, if clock signals BUFFCLK and BUFFZCLK are delayed and clock signals CLKP and CLKN are generated, the significant edges of clock signals BUFFCLK and BUFFZCLK are only the rising edges thereof.

Nevertheless, as described in the sixth embodiment, if data output clock signals CLKP and CLKN are generated based only on clock signal BUFFCLK, not only the rising edge of clock signal BUFFCLK but also the falling edge of clock signal BUFFCLK are of significance. This is because the rising edge of clock signal CLKP is formed by delaying the falling edge of clock signal BUFFCLK. This means that if the duty cycle of clock signal BUFFCLK is deviated from 50%, the phase difference between the rising edge of clock signal CLKP and that of clock signal CLKN is deviated from 180°.

In the seventh embodiment, clock signal BUFFCLK is passed through DCC circuit 150 and then inputted into delay line 32. By doing so, even if the duty cycle of clock signal BUFFCLK is deviated from 50%, it is possible to further advantageously improve the phase difference between the rising edge of clock signal CLKP and that of clock signal CLKN to be 180°.

In other words, because of the use of DCC circuit 150 which corrects a duty cycle, even if the duty cycle of an external clock is deviated from 50%, it is possible to output data at timing with a correct phase by complementary internal clocks.

Needless to say, since only one delay line is provided in DLL circuit 150 in the seventh embodiment as in the case of the sixth embodiment, it is possible to synchronize data outputs with external clock signals CLK and/CLK, respectively by feeding back only one clock signal, i.e., clock signal CLKP without the influence of the change of the level of the power supply potential for the DLL circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a delay locked loop circuit generating first and second internal clock signals in accordance with first and second external clock signals complementary to each other and applied from an outside, said delay locked loop circuit including
   a first variable delay circuit delaying said first external clock signal to output said first internal clock signal,
   a second variable delay circuit delaying said second external clock signal to output said second internal clock signal,
   a delay circuit receiving and delaying said first internal clock signal, and
   a phase comparison circuit comparing a phase of an output of said delay circuit with a phase of said first external clock signal to output a control signal according to a phase difference to said first and second variable delay circuits; and
   a potential supply section connected to said first variable delay circuit and connected to said second variable delay circuit in an electrically equivalent connection relationship to connection to said first variable delay circuit, and supplying a power supply potential to said first and second variable delay circuits.

2. The semiconductor device according to claim 1, further comprising
   a connection section connecting said potential supply section to said first and second variable delay circuits, wherein
   a first connection resistance value of said connection section between a connection point connected to said first variable delay circuit and a connection point connected to said potential supply section is substantially equal to a second connection resistance value of said connection section between a connection point connected to said second variable delay circuit and a connection point connected to said potential supply section.

3. The semiconductor device according to claim 2, wherein
   said connection section has
   a first power supply line having one end connected to said potential supply section,
   a second power supply line connecting the other end of said first power supply line to said first variable delay circuit, and a third power supply line connecting said other end of said first power supply line to said second variable delay circuit, and having a length substantially equal to a length of said second power supply line.

4. The semiconductor device according to claim 2, wherein
said connection section has
a first power supply line having one end connected to said potential supply section, and having the other end connected to said first variable delay circuit, and
a second power supply line having one end connected to said potential supply section, having the other end connected to said second variable delay circuit, and having a length substantially equal to a length of said first power supply line.

5. The semiconductor device according to claim 1, further comprising
a first power supply line supplied with a power supply potential from said potential supply section, wherein
said first variable delay circuit has
a plurality of first delay sections connected in series,
said second variable delay circuit has
a plurality of second delay sections connected in series; and
elements of said plurality of first delay sections and elements of said plurality of second delay sections are alternately connected to said first power supply line.

6. The semiconductor device according to claim 5, wherein
each of said plurality of first and second delay sections includes an inverter.

7. The semiconductor device according to claim 1, wherein
said semiconductor device is a synchronous semiconductor memory device transferring data at both edges of the external clock signal.

8. A semiconductor device comprising:
a delay locked loop circuit generating first and second internal clock signals in accordance with first and second external clock signals complementary to each other and applied from an outside, said delay locked loop circuit including
a first variable delay circuit delaying said first external clock signal to output said first internal clock signal,
a second variable delay circuit delaying said second external clock signal to output said second internal clock signal,
a delay circuit receiving and delaying said first internal clock signal, and
a phase comparison circuit comparing a phase of an output of said delay circuit with a phase of said first external clock signal, and outputting a control signal according to a phase difference to said first and second variable delay circuits;
an output buffer circuit outputting data to the outside in accordance with said first and second internal clock signals; and
first and second clock signal lines transmitting said first and second internal clock signals to said output buffer, respectively, wherein
a resistance value of said first clock signal line is substantially equal to a resistance value of said second clock signal line.

9. The semiconductor device according to claim 8, wherein a length of said first clock signal line is substantially equal to a length of said second clock signal line.

10. The semiconductor device according to claim 9, wherein
a distance between said first variable delay circuit and said output buffer circuit is substantially equal to a distance between said second variable delay circuit and said output buffer circuit.

11. The semiconductor device according to claim 8, wherein
said semiconductor device is a synchronous semiconductor memory device transferring data at both edges of each of the external clock signals.

12. A semiconductor device comprising:
a delay locked loop circuit generating first and second internal clock signals complementary to each other in accordance with an external clock signal applied from an outside, said delay locked loop circuit including
a variable delay circuit outputting a third internal clock signal in accordance with said external clock signal;
a phase adjustment circuit outputting said first internal clock signal in accordance with said third internal clock signal, and outputting said second internal clock signal having a falling edge equal in phase to a rising edge of said first internal clock signal and having a rising edge equal in phase to a falling edge of said first internal clock signal;
a delay circuit receiving and delaying said first internal clock signal; and
a phase comparison circuit comparing a phase of an output of said delay circuit with a phase of said external clock signal, and outputting a control signal according to a phase difference to said variable delay circuit.

13. The semiconductor device according to claim 12, wherein
said phase adjustment circuit includes
a plurality of first inverters receiving said internal clock signal to output said first internal clock, and connected in series as odd stages; and
a plurality of second inverters receiving said third internal clock signal to output said second internal clock, and connected in series as even stages, and
propagation delay time of said plurality of first inverters is substantially equal to propagation delay time of said plurality of second inverters.

14. The semiconductor device according to claim 13, wherein
each of said plurality of first inverters differs in size from each of said plurality of second inverters.

15. The semiconductor device according to claim 12, wherein
said delay locked loop circuit further includes
a waveform shaping circuit provided on a transmission path on which said external clock signal is transmitted from the outside to said phase adjustment circuit, and improving a duty cycle of an inputted signal.

16. The semiconductor device according to claim 12, wherein
said semiconductor device is a synchronous semiconductor memory transferring data at both edges of the external clock signal.

* * * * *